United States Patent
Kang et al.

(10) Patent No.: US 7,368,695 B2
(45) Date of Patent: May 6, 2008

(54) IMAGE SENSOR PACKAGE AND FABRICATION METHOD

(75) Inventors: Teck-Gyu Kang, San Jose, CA (US); Michael Estrella, San Jose, CA (US); Jae M. Park, San Jose, CA (US); Kenneth Robert Thompson, San Jose, CA (US); Craig S. Mitchell, San Jose, CA (US); Belgacem Haba, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 131 days.

(21) Appl. No.: 11/120,711

(22) Filed: May 3, 2005

(65) Prior Publication Data

US 2005/0279916 A1 Dec. 22, 2005

Related U.S. Application Data

(60) Provisional application No. 60/652,419, filed on Feb. 11, 2005, provisional application No. 60/567,473, filed on May 3, 2004.

(51) Int. Cl.
*H01L 27/00* (2006.01)

(52) U.S. Cl. .................. 250/208.1; 257/434; 257/680

(58) Field of Classification Search ............. 250/208.1; 257/434, 680
See application file for complete search history.

(56) References Cited

U.S. PATENT DOCUMENTS 3,775,844 A    12/1973   Parks
4,567,543 A    1/1986    Miniet
4,941,033 A    7/1990    Kishida
4,982,265 A    1/1991    Watanabe et al.
4,991,290 A    2/1991    MacKay
5,148,265 A    9/1992    Khandros et al.
5,172,303 A    12/1992   Bernardoni et al.
5,198,888 A    3/1993    Sugano et al.

(Continued)

FOREIGN PATENT DOCUMENTS

JP    2004-55574 A  *  2/2004

OTHER PUBLICATIONS

U.S. Appl. No. 10/077,388, Fjelstad, Joseph.

(Continued)

*Primary Examiner*—Georgia Epps
*Assistant Examiner*—Seung C Sohn
(74) *Attorney, Agent, or Firm*—Lerner, David, Littenberg, Krumholz & Mentlik, LLP

(57) ABSTRACT

An image sensor package is disclosed that reduces the overall size of known image sensor packages. The image sensor package includes an image sensor and image sensor controller that are arranged on a substrate so that the surfaces of the image sensor and image sensor controller are directly adjacent one another. A package in accordance with the present invention reduces the amount of space in the package by allowing at least one surface of the image sensor controller and at least one surface of the image sensor to be directly attached or connected to one another. Electrical conductive material in the nature of anisotropic conductive materials is also preferably applied to the substrate in the form of an adhesive layer to allow for the image sensor controller and the image sensor to be in electrical communication with one another.

21 Claims, 12 Drawing Sheets

U.S. PATENT DOCUMENTS

| | | | |
|---|---|---|---|
| 5,222,014 | A | 6/1993 | Lin |
| 5,224,023 | A | 6/1993 | Smith et al. |
| 5,281,852 | A | 1/1994 | Normington |
| 5,376,825 | A | 12/1994 | Tukamoto et al. |
| 5,433,911 | A * | 7/1995 | Ozimek et al. ............. 264/261 |
| 5,448,511 | A | 9/1995 | Paurus et al. |
| 5,776,797 | A | 7/1998 | Nicewarner, Jr. et al. |
| 6,093,029 | A | 7/2000 | Kwon et al. |
| 6,121,676 | A | 9/2000 | Solberg |
| 6,140,164 | A | 10/2000 | Zhang |
| 6,172,418 | B1 | 1/2001 | Iwase |
| 6,208,521 | B1 | 3/2001 | Nakatsuka |
| 6,225,688 | B1 * | 5/2001 | Kim et al. .................. 257/686 |
| 6,342,406 | B1 * | 1/2002 | Glenn et al. .................. 438/57 |
| 6,345,205 | B1 | 2/2002 | Inamasu et al. |
| 6,396,116 | B1 * | 5/2002 | Kelly et al. ................. 257/432 |
| 6,462,412 | B2 | 10/2002 | Kamei et al. |
| 6,469,377 | B1 | 10/2002 | Kondo |
| 6,787,869 | B1 * | 9/2004 | Vittu ........................... 257/434 |
| 6,943,424 | B1 * | 9/2005 | Kim ............................. 257/433 |
| 7,091,599 | B2 * | 8/2006 | Fujimori ..................... 257/692 |
| 2001/0006252 | A1 | 7/2001 | Kim et al. |
| 2001/0048064 | A1 * | 12/2001 | Kitani ..................... 250/208.1 |
| 2002/0044213 | A1 * | 4/2002 | Shinomiya et al. ......... 348/340 |
| 2002/0057468 | A1 * | 5/2002 | Segawa et al. ............. 358/509 |
| 2002/0096730 | A1 * | 7/2002 | Tu et al. ..................... 257/433 |
| 2004/0041247 | A1 * | 3/2004 | Kinsman ..................... 257/678 |
| 2004/0251509 | A1 * | 12/2004 | Choi ........................... 257/432 |
| 2005/0073017 | A1 * | 4/2005 | Kim ............................ 257/433 |
| 2005/0095835 | A1 | 5/2005 | Humpston et al. |
| 2005/0139848 | A1 * | 6/2005 | Yee ............................... 257/98 |
| 2005/0163016 | A1 * | 7/2005 | Kimura .................. 369/112.01 |
| 2005/0231482 | A1 * | 10/2005 | Theytaz et al. ............. 345/166 |
| 2005/0236684 | A1 * | 10/2005 | Chen et al. ................. 257/433 |
| 2005/0253211 | A1 * | 11/2005 | Minamino et al. .......... 257/432 |

OTHER PUBLICATIONS

U.S. Appl. 60/403,939, filed Aug. 16, 2002, Bang, et al.
Fjelstad, An Engineer's Guide to Flexible Circuit Technology (ElectroChemical Publications Limited 1997; ISBN 0901150347), pp. 148-149.
Bang, U.S. Appl. No. 10/656,534, filed Sep. 5, 2003.
Kim et al., U.S. Appl. No. 09/776,356, filed Feb. 2, 2001.
"Megabyte Per Cubic Inch," Defense Science, May 1988, p. 56.
"Three-Dimensional Packaging," Defense Science, May 1988, p. 65.
Newsam, U.S. Appl. No. 60/314,042, filed Aug. 22, 2001.
Mohammed, PCT/US02/26805, filed Aug. 22, 2002.

* cited by examiner

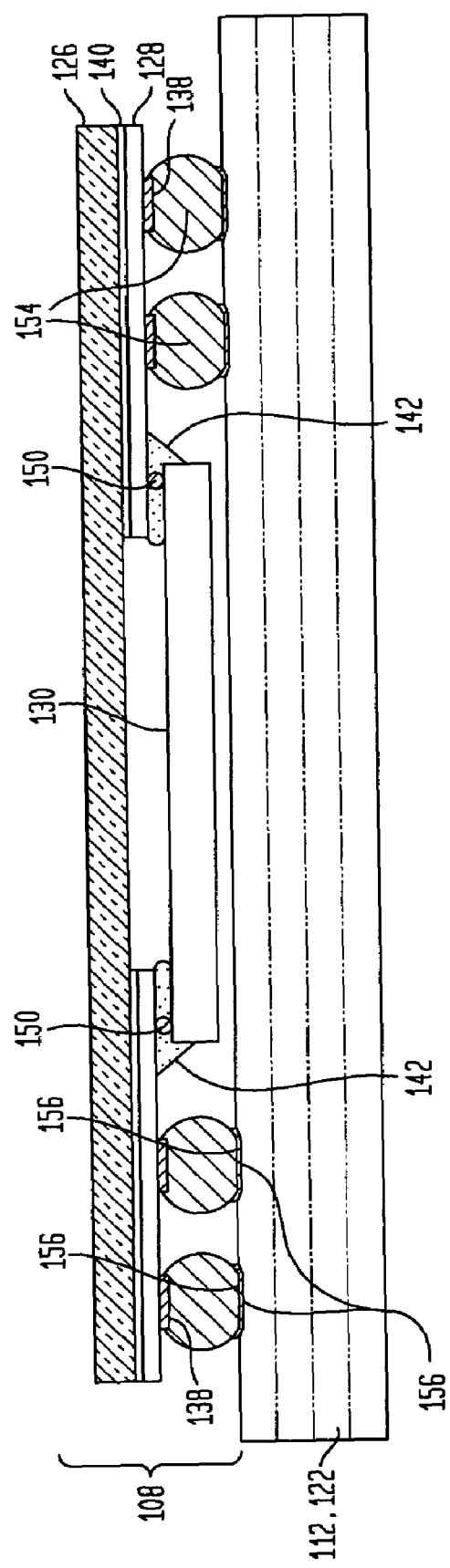

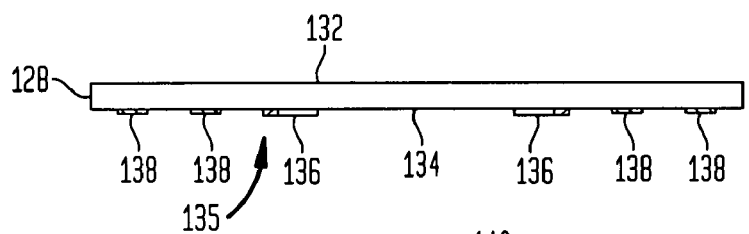
FIG. 4A
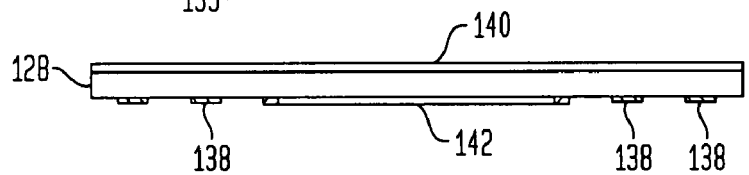
FIG. 4B
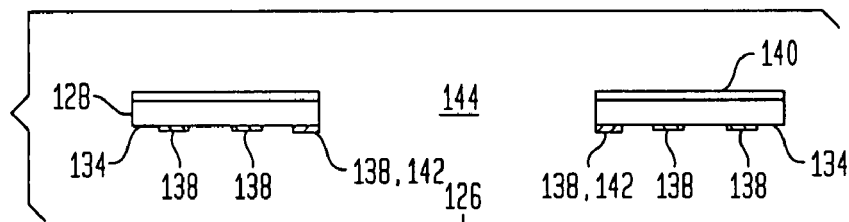
FIG. 4C
FIG. 4D
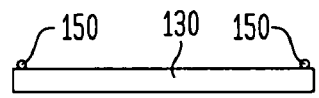
FIG. 4E
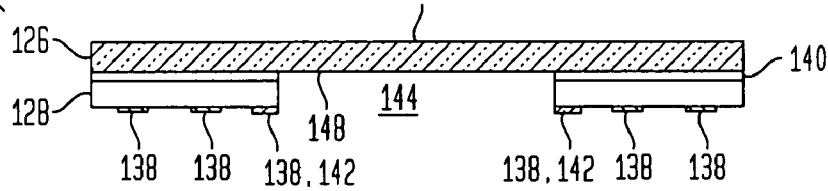
FIG. 4F
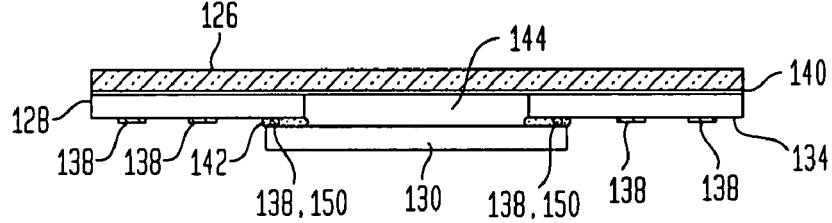
FIG. 4G
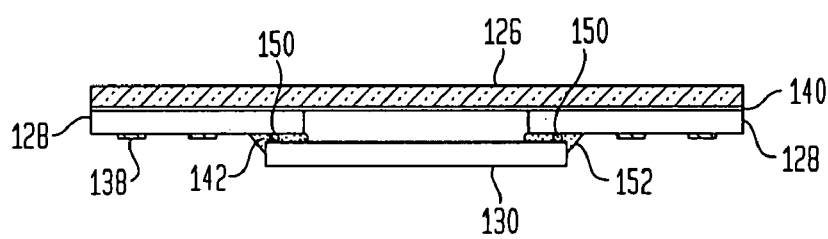
FIG. 4H

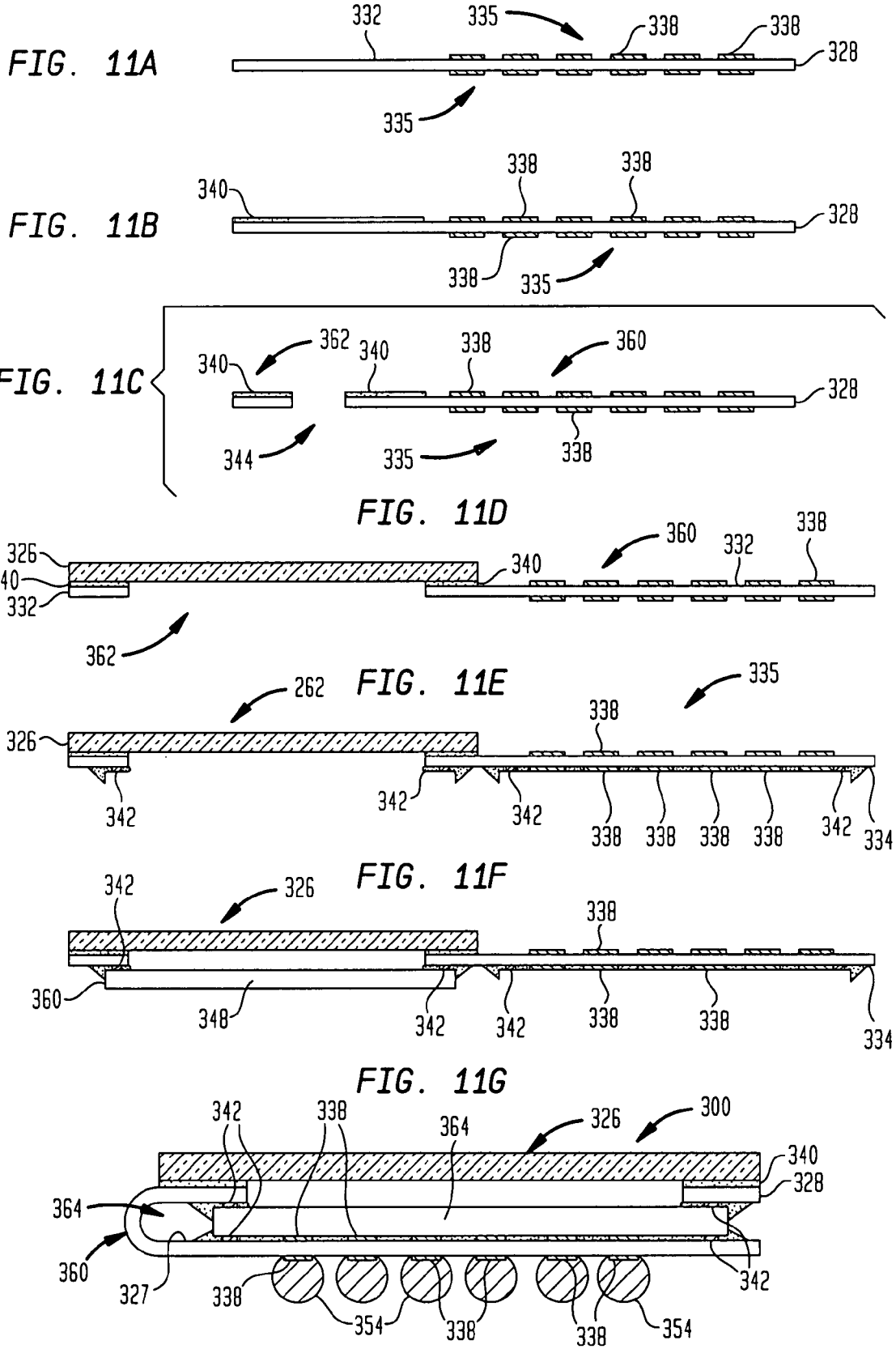

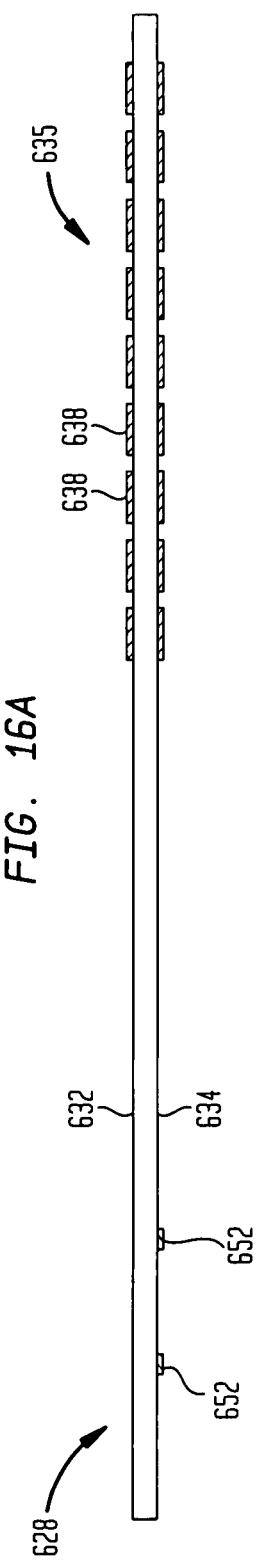
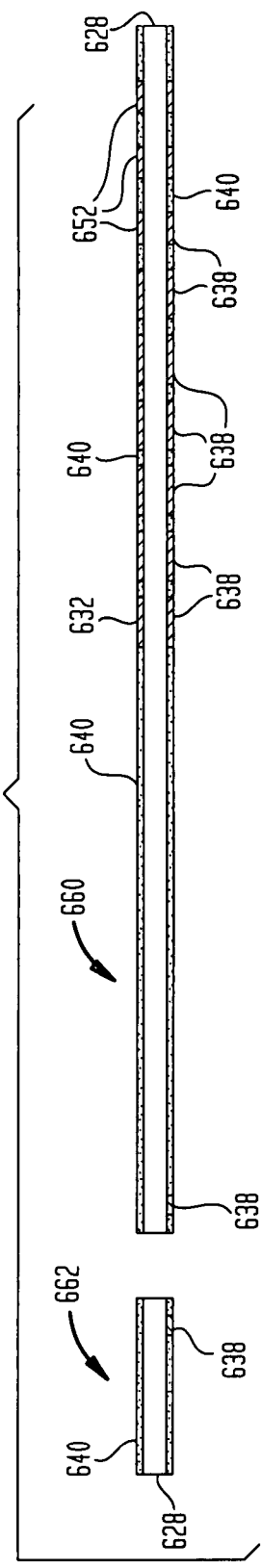
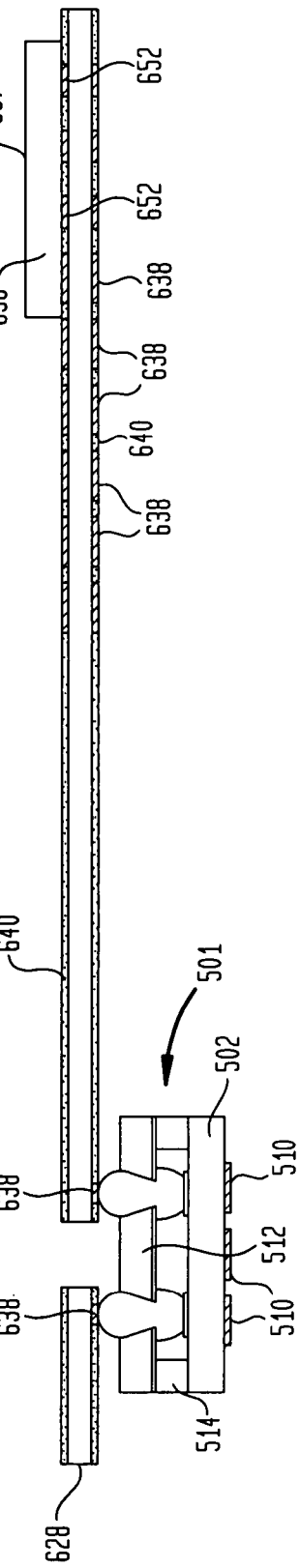
FIG. 16A
FIG. 16B
FIG. 16C

IMAGE SENSOR PACKAGE AND FABRICATION METHOD

CROSS REFERENCE TO RELATED APPLICATIONS

This application claims the benefit of the filing date of U.S. Provisional Patent Application No. 60/567,473 filed on May 3, 2004, and U.S. Provisional Patent Application No. 60/652,419 filed on Feb. 11, 2005, the disclosures of which are hereby incorporated herein by reference.

BACKGROUND OF THE INVENTION

Improvements in image processing technology and CPU performance have allowed for the incorporation of digital image technology into various electronic devices. In particular, cellular phones and personal digital assistants (PDA's) have been marketed with image processing technology which allows for the capture of digital images via an internal image sensor and controller, e.g., a digital camera. Image processing technology can also be incorporated into other electronic devices such as calculators, computers, watches, pagers, walkie-talkies and the like.

Image processing technology incorporates the use of semiconductor components for capturing light images and processing same in digital form within the electronic device. Image sensors are known to be constructed using various technologies, for example, CMOS (complementary metal oxide semiconductor) and CCD (charged coupled device). In certain applications such as cellular phones, it is preferred to use CMOS image sensors, notwithstanding that CCD image sensors provide higher quality. In this regard, CMOS image sensors require less power consumption, can be fabricated using semiconductor processing techniques at lower costs than those used in fabricating CCD image sensors, can be operated by a single power supply with lower power consumption than that of CCD image sensors, and use integrated logic circuits in the image sensor chip thereby minimizing package size in comparison with CCD image sensors. Examples of CMOS image sensors and manufacturing methods are described in U.S. Pat. Nos. 6,610,557 and 6,727,487, the disclosures of which are incorporated herein by reference.

In cellular phone applications, thickness of the image sensor package is important because of the lens housing which is added on top of the package for the electronic device. Today, a typical camera module thickness (package plus lens housing) is about 10 mm. In order to minimize camera module thickness, there is being developed new technology to achieve thinner camera modules and packages. Image sensor packages using chip scale package (CSP) technology are becoming a typical trend in the package industry. In addition, solder ball joint reliability is becoming an important factor for image sensor CSP development.

Accordingly, there is the need for improvements in image sensor package technology in order to minimize camera module thickness, as well as enhancing solder joint reliability. These attributes of the present invention are achieved by the construction of the image sensor package and method of fabrication as described hereinafter.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

FIG. 3 is a diagrammatic front elevational view of an image sensor package constructed in accordance with an embodiment of the present invention;

FIGS. 4A-4H are sequential diagrammatic front elevational views showing the sequence in fabricating an image sensor package in accordance with an embodiment of the present invention;

FIGS. 11A-11G are sequential diagrammatic front elevational views showing the sequence in fabricating an image sensor package in accordance with an embodiment of the present invention.

FIGS. 16A-16D are sequential diagrammatic front elevational view of an image sensor package constructed in accordance with an embodiment of the present invention.

SUMMARY OF THE INVENTION

Figure 1:
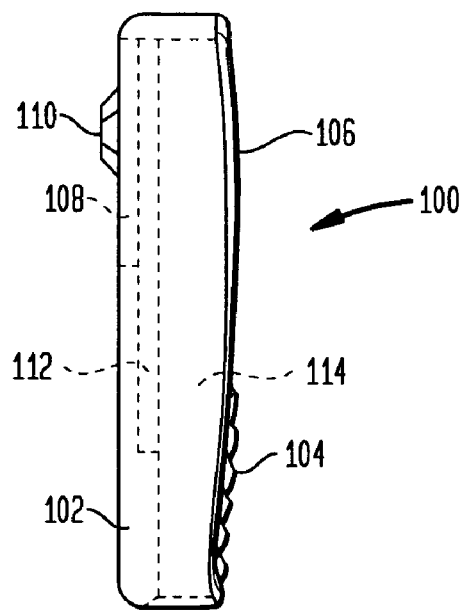
FIG. 1 is a side elevational view of an electronic device in the nature of a cellular phone incorporating an image sensor package in accordance with an embodiment of the present invention.

The present invention is generally directed to image sensor packages and processes of fabricating same. The image sensor package is constructed to be relatively thin thereby being adaptable for use in various electronic devices such as cellular phones, PDA's, calculators, watches, computers, walkie-talkies, pagers and the like.

In accordance with one embodiment, the image sensor package includes a substrate provided with an opening extending therethrough. Electrical conductive elements such as circuit tracers, contacts and/or pads are formed on one of the surfaces of the substrate. An image sensor is arranged in alignment with the opening in the substrate, with peripheral portions of the image sensor facing peripheral portions of the substrate surrounding the opening. The image sensor is electrically coupled to the electrical conductive elements using electrical conductive material arranged therebetween. In the preferred embodiment, the electrical conductive material is in the nature of anisotropic conductive material which may also have adhesive properties.

A transparent body which allows transmission of light images is adhered to an exposed surface of the substrate overlying the opening opposing the image sensor. In this arrangement, the substrate is sandwiched between the transparent body and the image sensor. The transparent body is adhered to the substrate using a suitable adhesive such as an elastomer adhesive, for example, silicone adhesive. In the preferred embodiment, the elastomer adhesive is a compliant layer which will absorb the coefficient of thermal expansion (CTE) mismatch between the transparent body and the circuit board of the electronic device thereby creating a stress buffer. Solder balls are formed on the contacts or pads of the electrically conductive elements on the surface of the substrate surrounding the image sensor. The image sensor package construction provides minimum package thickness with the solder ball height accommodating the thickness of the image sensor.

In one embodiment of the present invention there is described an image sensor package comprising an image sensor having opposing first and second surfaces; a transparent body coupled to the image sensor overlying the first surface; and a substrate having electrical conductive elements, the substrate attached to the transparent body with the electrical conductive elements in electrical communication with the image sensor.

In a further embodiment of the present invention there is described an image sensor package comprising an image sensor having opposing first and second surfaces; a substrate having opposing first and second surfaces and an opening extended therebetween, the second surface of the substrate having electrical conductive elements, the image sensor arranged in alignment with the opening with the first surface of the image sensor opposing the second surface of the substrate, the image sensor electrically coupled to the electrical conductive elements on the second surface of the substrate; a transparent body having opposing first and second opposing surfaces, the transparent body arranged in alignment with the opening opposing the image sensor with the second surface of the transparent body attached coupled to the first surface of the substrate.

In a further embodiment of the present invention there is described an image sensor package comprising a substrate having opposing first and second surfaces and an opening therein, the second surface support electrical conductive elements, and a plurality of solder balls attached to the electrical conductive elements; a transparent body adhered to the first surface of the substrate overlying the opening; an image sensor having opposing first and second surfaces, the first surface of the image sensor arranged opposing the body in alignment with the opening, the image sensor adhered in electrical continuity with the electrical conductive elements on the second surface of the substrate, wherein the height of the solder balls is greater than the height of the image sensor.

In a further embodiment of the present invention there is described an electronic device for creating digital images, the device comprising a housing; an electronic module within the housing; an image sensor having opposing first and second surfaces; a transparent body coupled to the image sensor overlying the first surface; and a substrate having electrical conductive elements, the substrate attached to the transparent body with the electrical conductive elements in electrical communication with the image sensor, the image sensor electrically coupled to the electronic module.

In a further embodiment of the present invention there is described an electronic device for creating digital images, the device comprising a housing; an electronic module within the housing; an image sensor having opposing first and second surfaces; a substrate having opposing first and second surfaces and an opening extended therebetween, the second surface of the substrate having electrical conductive elements, the image sensor arranged in alignment with the opening with the first surface of the image sensor opposing the second surface of the substrate, the image sensor electrically coupled to the electrical conductive elements on the second surface of the substrate; a transparent body having opposing first and second opposing surfaces, the transparent body arranged in alignment with the opening opposing the image sensor with the second surface of the transparent body coupled to the first surface of the substrate, the image sensor electrically coupled to the electronic module.

In a further embodiment of the present invention there is described a method of making an image sensor package comprising providing a substrate having opposing first and second surfaces; forming electrical conductive elements on the second surface of the substrate; forming an opening extending through the substrate between the first and second surfaces thereof; adhering a transparent body to the first surface of the substrate overlying the opening therein; electrical coupling an image sensor to the electrically conductive elements on the second surface of the substrate in alignment with the opening opposing the transparent body.

In one embodiment, an image sensor package is disclosed that includes a substrate that has first and second surfaces and an opening that extends from the first surface to the second surface. A transparent body, image sensor, and image sensor controller are coupled to the substrate and are in electrical communication with one another. Both the image sensor and image sensor controller have opposing first and second surfaces that are electrically coupled to the substrate. The package is arranged and constructed so that the second surface of the image sensor and the second surface of the image sensor are directly attached to one another.

In an alternative embodiment, an anisotropic adhesive is used to adhere the image sensor and/or images sensor controller to the substrate. This permits the image sensor and image sensor controller to be in electrical communication with one another.

In another alternative embodiment according to this aspect of the invention, instead of using anisotropic adhesives to place the image sensor and image sensor controller in electrical communication with one another, wires may alternatively be used to conduct electrical current through the substrate and to both the image sensor and image sensor controller.

In another embodiment of this aspect of the present invention, the substrate is folded over itself.

The claimed invention also contemplates an electronic device for creating digital images, wherein the device comprises a housing; an electronic module within said housing; and an image sensor package within said housing. The image sensor package includes a substrate that has opposing first and second surfaces and an opening therein. The transparent body is attached to the first surface of said substrate and overlies the opening and first surface of the image sensor. An image sensor controller is attached to the substrate and has opposing first and second surfaces. The second surface of the image sensor controller and second surface of the image are directly attached to one another. The first and second surfaces of the substrate support electrical conductive elements to permit the image sensor and the image sensor controller to be in electrical communication with one another. The electronic module is responsive to the image sensor controller for at least creating a digital image within the housing. Furthermore, the image sensor and said image sensor controller electrically coupled to said electronic module.

In an alternative embodiment, the image sensor and image sensor controller may be combined together as a single image sensing chip or unit. When the image sensor and image sensor controller are combined, this reduces the overall size of the image sensor package.

In yet another alternative embodiment, there is a capped image sensor chip that is attached to a flexible substrate having first and second surfaces and electrical conductive elements located on the first and second surfaces. The capped image sensor chip is directly attached to the image sensor controller, and is in electrical communication with the image sensor controller.

In another aspect of the present invention, there is disclosed a method of making an image sensor package that includes providing a substrate having opposing first and second surfaces, and having an opening extending through the substrate between the first and second surfaces, and electrical conductive elements on one of said surfaces; adhering a transparent body to one surface of the substrate so that the transparent body is overlying the opening; attaching an image sensor having a surface to the other surface of the substrate so that the image sensor is aligned with said opening of the substrate and the transparent body; electrically coupling an image sensor controller on the other surface of the substrate proximate the image sensor; and folding the flexible substrate so that a surface of the image sensor and a surface of the image sensor controller are directly adjacent one another.

In another aspect in accordance with the present invention, an image sensor package comprises a transparent body having first and second surfaces, wherein the second surface is circuitized. An image sensor is attached to the transparent body by at least one first pair of solder balls and at least one second pair of solder balls attached to the second surface of the transparent body so that the thickness of the second pair of solder balls Is greater than a combined thickness of the image sensor and the first pair of solder balls. Use of the solder balls permits the electrical connection of the image sensor package to a secondary device, such as a digital signal processor.

DETAILED DESCRIPTION OF THE PREFERRED EMBODIMENTS

In describing the preferred embodiments of the invention illustrated in the drawings, specific terminology will be used for the sake of clarity. However, the invention is not intended to be limited to the specific terms so selected, and it is to be understood that each specific term includes all technical equivalents that operate in a similar manner to accomplish a similar purpose.

Referring now to FIG. 1, there is shown in diagrammatic illustration a cellular phone generally designated by reference number 100. The cellular phone 100 includes a housing 102, a keypad 104 and a display 106. An image sensor package 108 is positioned within the housing 102 adjacent focusing lens 110. The image sensor package 108 is electrically coupled to a circuit board 112 for the cellular phone 100. The circuit board 112 provides electrical connection to the many components of the cellular phone 100 required for its operation, generally designated by electronic module 114. The electronic module 114, by way of example, may include microprocessors, power supply, semiconductor devices such as memory devices, circuit boards and other components required for the operation of the cellular phone 100, display 106 and image sensor package 108.

Figure 2:
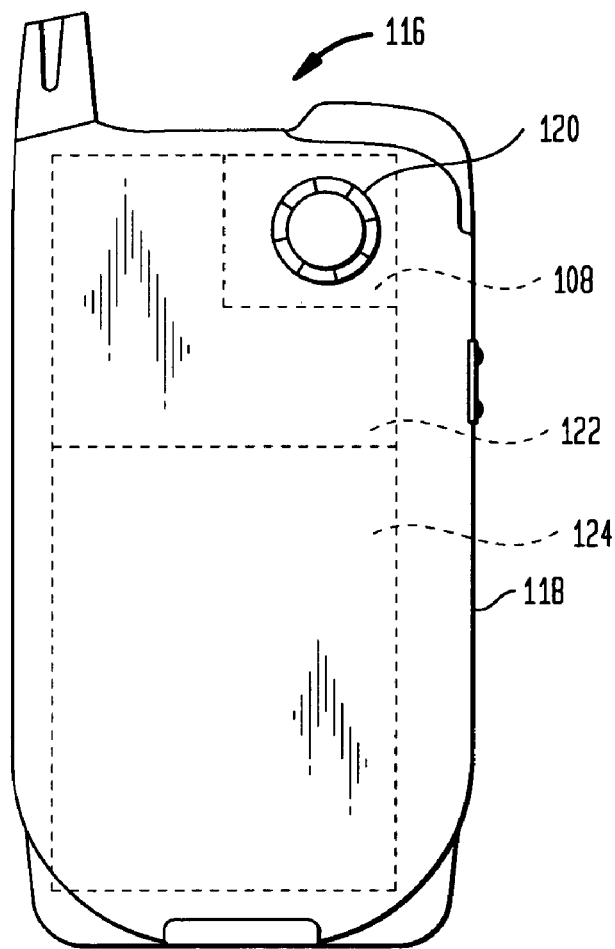
FIG. 2 is a bottom plan view of an electronic device in the nature of a personal digital assistant incorporating an image sensor package in accordance with an embodiment of the present invention.

In another embodiment, the present invention is adaptable for capturing digital images using a PDA 116 as shown in FIG. 2. The PDA 116 includes a housing 118 supporting a display and various control buttons (not shown). The image sensor package 108 is contained within the housing 118 adjacent focusing lens 120. The image sensor package 108 is electrically coupled to a circuit board 122 for the PDA 116. As in the cellular phone 100, the circuit board 122 is coupled to other components requited for the operation of the PDA, for example, microprocessors, memory devices, power supply and the like, all generally designated as electronic module 124. These components are those generally required for the operation of the PDA 116 and the image sensor package 108. It is to be understood that the present invention is adaptable to a variety of electronic devices such as those noted herein by way of example.

There will now be described the construction of an image sensor package 108 in accordance with one embodiment of the present invention as shown in FIG. 3. The basic elements of the image sensor package 108 include a transparent body 126, a substrate 128, and an image sensor 130. For a greater understanding of the construction of the image sensor package 108, reference will also be made to FIGS. 4A-4H which disclose one embodiment of fabricating the image sensor package.

Referring to the aforementioned figures, and in particular FIG. 4A, the substrate 128 is generally a flat planar substrate having opposing first and second surfaces 132, 134. The substrate 128 can be formed from a variety of dielectric materials, both rigid and flexible, such as polyimide and polyester materials, such as Kapton and Mylar. Other substrates of similar material used, for example, as printed circuit boards in the electronic industry may also be used for the substrate 128.

The substrate 128 is circuitized by forming on the second surface 134 a plurality of electrical conductive elements 135 such as circuit traces 136 and contacts 138. The electrical conductive elements 135 can be formed from conductive material such as copper, gold, gold plated copper and various metal alloys. The electrical conductive elements 135 can be formed using both additive and subtractive etching processes, using positive and/or negative photoresist mask materials. In addition, the electrical conductive elements 135 can be formed by various ablation processes, lamination techniques and bonding of pre-formed electrical conductive elements on the substrate surface. All of these processes for forming the electrical conductive elements 135 are well known in the semiconductor processing art.

As shown in FIG. 4B, the first surface 132 of the substrate 128 is coated with an adhesive layer 140 for adhering the transparent body 126 thereto. The adhesive layer 140 in the preferred embodiment is any adhesive using a suitable dielectric elastomer material which can be thermal set and applied typically as a dry film. In the preferred embodiment, the adhesive layer 140 is also a compliant material. The compliant material has the benefit of absorbing CTE mismatch between the image sensor package 108 and the circuit board 112, 122 of the electronic device. More specifically, a compliant adhesive layer 140, due to the CTE mismatch, will act as a stress buffer between the transparent body 126 and the circuit board 112, 122 of the electronic device. By the use of a compliant adhesive 140, it is contemplated that the image sensor package 108 will have higher reliability with respect to the solder joints formed between the image sensor package and the circuit board 112, 122 as described hereinafter. In accordance with one embodiment, the compliant adhesive layer 140 can be a silicone elastomer adhesive having a low modulus of elasticity, e.g., about 5 Mpa. However, it is to be understood that it is not a requirement of the present invention that the layer 140 be compliant and that other polymer materials and adhesives can be used for adhering the transparent body 126 to the substrate 128.

An adhesive layer 142 of a conductive material is applied to a portion of the second surface 134 of the substrate 128. The location of the adhesive layer 142 corresponds to the location for adhering the image sensor 130 to the substrate 128. The adhesive layer 142 is applied overlying designated portions of the electrical conductive elements 135 such as the contacts 138 and/or traces 136 which are to be used for electrically coupling the electrical conductive elements to the image sensor 130. In the preferred embodiment, the adhesive layer 142 is in the nature of an anisotropic conductive material which provides electrical conductivity in the transverse direction between the joined elements, while being in the nature of an electrical insulator in the other direction. This allows the adhesive layer 142 to be applied over a plurality of traces 136 and/or contacts 138 as a single layer. In the alternative, it is contemplated that the adhesive layer 142 may be in the nature of a conductive material which does not exhibit anisotropic properties. In such event, it would require that the conductive material be applied only to the individual contacts 138 to be bonded to the image sensor 130. Anisotropic conductive materials, as well as other conductive materials are well known in the semiconductor processing art.

Referring to FIG. 4C, an opening 144 is formed in the substrate 128 using any suitable process, for example, die-cutting, etching, laser ablation and the like. The opening 144 at the second surface 134 of the substrate 128 is surrounded by the adhesive layer 142. The opening 144 can have any desirable shape, for example, round, oval, square and the like. The opening 144 is sized so that the contacts 138 on the second surface 134 of the substrate 128 will align with electrical conductive elements, such as contacts and/or stud bumps, on the image sensor 130.

Referring to FIG. 4D, the transparent body 126 is in the nature of a planar substrate having opposing first and second surfaces 146, 148. In a preferred embodiment, the transparent body 126 is in the nature of window or optical glass which allows for light transmission so that images can be captured by the image sensor 130. It is also contemplated that the transparent body 126 can be formed from IR filter material. Although window or optical glass is preferred for the transparent body 126, it is contemplated that the transparent body can be formed from various polymer materials. In this case, it is contemplated that the polymer selected will be capable of withstanding the reflow temperature for the solder balls use for joining the image sensor package 108 to the circuit board 112, 122 as to be described hereinafter. In the case of lead-free solder balls, it is contemplated that a temperature greater than 250° C. is required to be withstood by the transparent body 126 when formed from polymer materials.

The transparent body 126 is adhered to the substrate 128 by the adhesive layer 140. This is achieved by heating to the appropriate temperature to cure the adhesive layer 140 which, in the preferred embodiment, is in the nature of a dry film elastomer thermoset material. During the heating process, the adhesive layer 142 is not cured, as this layer in the preferred embodiment is a thermoplastic anisotropic conductive material. The resulting assembly provides a portion of the transparent body 126 forming a window aligned with the opening 144 in the substrate 128 opposing the image sensor 130.

Referring to FIG. 4E, the image sensor 130 is in the nature of a die or chip including the required semiconductor elements for sending light transmitted through the transparent body 126 for creating images by use of the electronic device. The image sensor 130 can use various image processing technologies, for example, CMOS and CCD sensors. CMOS image sensors and CCD sensors are well known in the image processing art. As to CMOS sensors, such sensors are further disclosed in the aforementioned U.S. Pat. Nos. 6,610,557 and 6,727,487, the disclosures of which are incorporated herein by reference.

Referring to FIG. 4F, the image sensor 130 is arranged in alignment with opening 144 within the substrate 128 opposing the transparent body 126. The image sensor 130 is preferably provided with a plurality of stud bumps 150 on the image sensor's contacts (not shown) which will align with the contacts 138 on the substrate 128 to provide electrical connection therebetween. The stud bumps 150 may be gold or other suitable metal materials, formed by any technique as is known in the semiconductor processing art. For example, the stud bumps 150 may be fabricated using conventional wire bonding processes by cutting off the wire after forming the wire head on the image sensor 130. The stud bumps 150 are aligned with the corresponding contacts 138 forming part of the electrical conductive elements 135 on the second surface 134 of the substrate 128. The image sensor 130 is electrically coupled to the electrically conductive elements 135 via the adhesive layer 142, which is an anisotropic conductive material in accordance the preferred embodiment. In this regard, the image sensor 130 is attached to the substrate 128 using thermal compression bonding.

Referring to FIG. 4G, the bond interface between the image sensor 130 and the substrate 128 surrounding the adhesive layer 142 may be encapsulated to provide a hermetically sealed package using an encapsulant 152. The encapsulant is a non-conductive, dielectric material, preferably a polymer which can be either thermoset or thermoplastic materials. The encapsulant 152 can be a compliant or rigid material as desired. Encapsulant material suitable for use as encapsulant 152 are well known in the semiconductor processing art.

The image sensor package 108 is completed as shown in FIG. 4H by forming solder balls 154 on the contacts 138 provided on the second surface 134 of the substrate 128. The solder balls 154 may be formed of any suitable conductive material, such as copper, gold, copper-gold alloys and the like, which have the desired conductive properties for forming interconnections between contacts. The materials for the solder balls 154 and process of forming same are well known in the semiconductor processing art. The resulting image sensor package 108 is further shown in FIG. 3.

Referring to FIG. 3, the image sensor package 108 is ball bonded to the circuit board 112, 122 of the electronic device. As shown, the circuit board 112, 122 includes a plurality of contacts 156 on its upper surface in electrical continuity with various circuit traces (not shown). The image sensor package 108 is arranged overlying the circuit board 112, 122, with its solder balls 154 aligned with the corresponding contacts 156 on the circuit board. Using conventional solder reflow techniques, connection is provided between the contacts 156 on the circuit board 112, 122 and the contacts 138 on the substrate 128, thereby providing electrical communication to the image sensor 130. As shown in FIG. 3, the height or thickness of the solder balls 154 is greater than the height or thickness of the image sensor 130. This construction provides minimum package thickness as the solder ball thickness can accommodate the thickness of the image sensor 130.

The light images sensed by the image sensor 130 often requires further processing in order to create the image of the captured picture to be displayed by the electronic device. This processing includes, for example, increasing the brightness of the image, sharpness, contrast, zoom features, etc. To this end, there is known in image processing technology an image sensor controller. The image sensor controller accordingly performs the required functions for converting the digital signals received from the image sensor 130 into the picture displayed by the electronic device. The image sensor controller is typically formed as a semiconductor chip having the appropriate electronic circuitry for performing these functions and is well known in the image processing art. The image sensor controller may be coupled to the image sensor 130 within the electronic device in a variety of arrangements.

Figure 5:
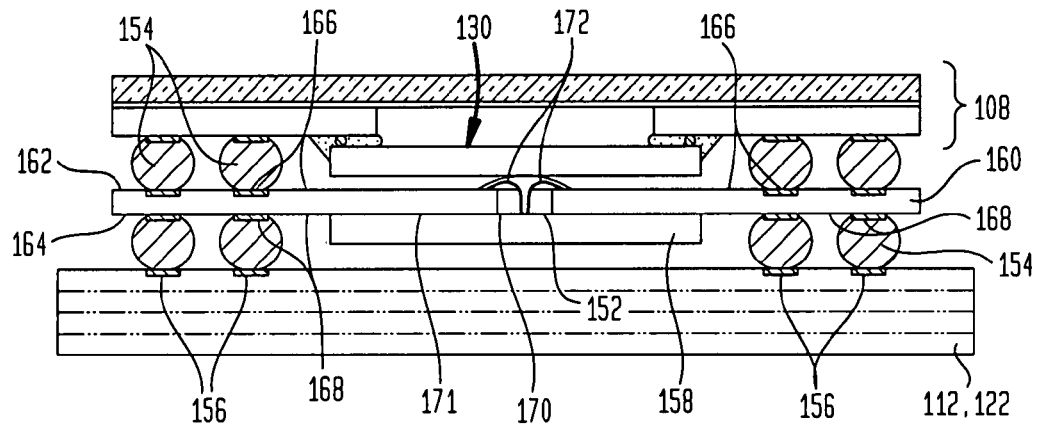
FIG. 5 is a diagrammatic front elevational view of an image sensor package constructed in accordance with another embodiment of the present invention.

Referring to FIG. 5, an image sensor controller 158 is shown electrically coupled between the image sensor 130 and circuit board 112, 122 pursuant to one embodiment of the present invention. More specifically, a substrate 160, which may be similar to substrate 128, has opposing first and second surfaces 162, 164. Electrical conductive elements 166, such as conductive traces and contacts, are formed on the first surface 162 in a circuitized pattern. Similarly, electrical conductive elements 168, such as circuit traces and contacts, are formed on the second surface 164 of the substrate 160 in a circuitized pattern. The specific layout of the circuitized patterns of the electrical conductive elements 166, 168 will be dependent upon the nature of the electronic device and the imaging functions being provided. The electrical conductive elements 166, 168 may be formed in the same manner and of the same materials as the electrical conductive elements 135 provided on the second surface 134 of the substrate 128.

The substrate 160 is provided with an opening 170 extending therethrough. The image sensor controller 158 may be provided with contact pads or stud bumps (not shown) on its upper surface. The image sensor controller 158 can be electrically coupled to the electrical conductive elements 168 in a similar manner as coupling the image sensor 130 to the electrical conductive elements 135 on the substrate 128. In this regard, an adhesive layer 171 of anisotropic conductive thermoplastic material provides electrical connection between the contacts or stud bumps on the image sensor controller 158 with the electrical conductive elements 168. The selected contacts on the image sensor controller 158 are coupled to the electrical conductive elements 166 on the first surface 162 of the substrate 160 via stitch bonding. As shown, connection between the electrical conductive elements 166, 168 is achieved by stitch bonding wires 172 through opening 170, which opening may be later filled with an encapsulant 152 as previously described. As such, the bond wires 172 provide electrical continuity between the image sensor controller 158 and the electrical conductive elements 166.

The electrical conductive elements 166 are in turn electrically coupled to the electrical conductive elements on the substrate 128 via the solder balls 154 as previously described with respect to electrical connection with the circuit board 112, 122. In this regard, the substrate 160 is arranged underlying the image sensor 130 opposing substrate 128, with their respective electrical conductive elements to be connected in alignment with one another. Accordingly, the solder balls 154 are aligned with the appropriate contacts forming part of the electrical conductive elements 166. In a similar manner, the circuit board 112, 122 is electrically coupled to the image sensor controller 158 via solder balls 154. Based upon this stacked arrangement, it will be appreciated that both the image sensor 130 and image sensor controller 158 are electrically coupled to the electronic modules 114, 124 of the electronic device via the circuit board 112, 122.

Figure 6:
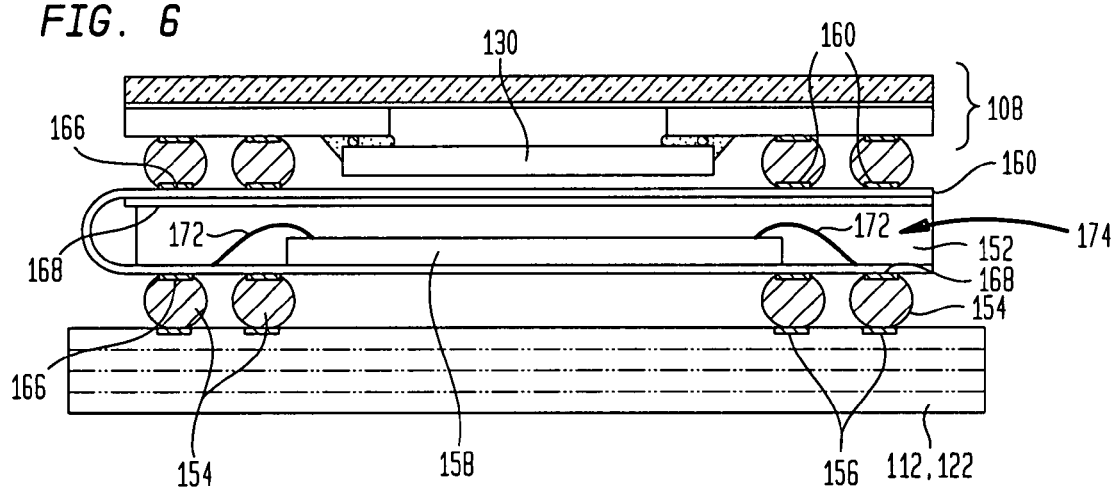
FIG. 6 is a diagrammatic front elevational view of an image sensor package constructed in accordance with another embodiment of the present invention.

Referring to FIG. 6, there is shown another arrangement for coupling the image sensor controller 158 to the image sensor 130. In this embodiment, the substrate 160 is flexible or provided with fold lines so as to be folded about itself forming a pocket 174 therebetween. The image sensor controller 158 is bonded to the inner surface of the substrate 160 within the pocket 174. The image sensor controller 158 may be electrically coupled to the electrical conductive elements 166, 168 directly by wire bonds 172 such as through conductive vias within the substrate 160. The pocket 174 is subsequently filled with encapsulant 152 of the type as previously described. Depending upon the circuit construction, the image sensor controller 158 may be secured to the substrate 160 using non-conductive adhesive materials, relying upon the wire bonds 172 for electrical connection to the electrical conductive elements 166, 168. In other cases, conductive anisotropic adhesive material may be used where the image sensor controller 158 is provided with stud bumps or contacts for electrically connecting with the electrical conductive elements 166, 168.

Figure 7:
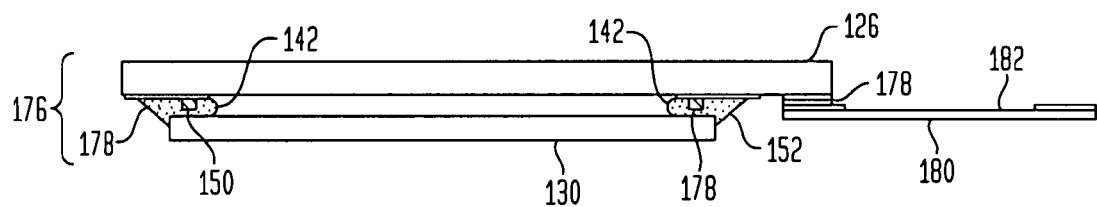
FIG. 7 is a diagrammatic front elevational view of an image sensor package constructed in accordance with another embodiment of the present invention.

Referring to FIG. 7, there is shown another embodiment of an image sensor package generally designated by reference number 176. The image sensor package 176 eliminates the use of the substrate 128 previously described in the aforementioned embodiments. The bottom surface of the transparent body 126 outwardly of its center region is circuitized with electrical conductive elements 178 including, for example, circuit traces and contacts. The image sensor 130 is electrically coupled to the electrical conductive elements 178 using conductive layer 142, preferably an anisotropic conductive adhesive. The bond interface may be sealed hermetically about its outer periphery using an encapsulant 152 as previously described.

Figure 8:
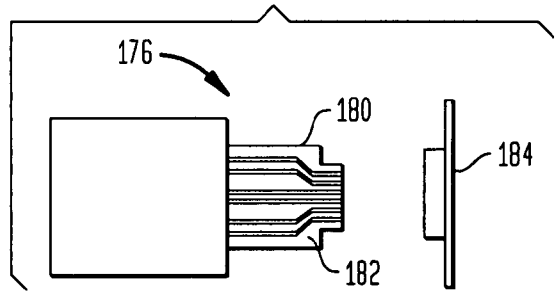
FIG. 8 is diagrammatic top plan view of the image sensor package shown in FIG. 7 adapted to be coupled to a socket device.

A circuit board 180 having a circuitized pattern of electrical conductive elements 182 thereon is adhered to the transparent body 126 in electrical continuity with the electrical conductive elements 178 using suitable conductive material therebetween (FIG. 8). For example, electrical continuity can be achieved using conductive anisotropic adhesive material, conventional conductive materials, solder and the like. The circuit board 180 is preferably rigid, although a flexible circuit board is contemplated. The circuit board 180 is inserted into a connector 184 as is conventionally used in electronic devices such as computers and like. The connector 184 is used to electrically couple the image sensor package 176 to other components within the electronic device, for example, to an electronic module 114, 124.

Figure 9:
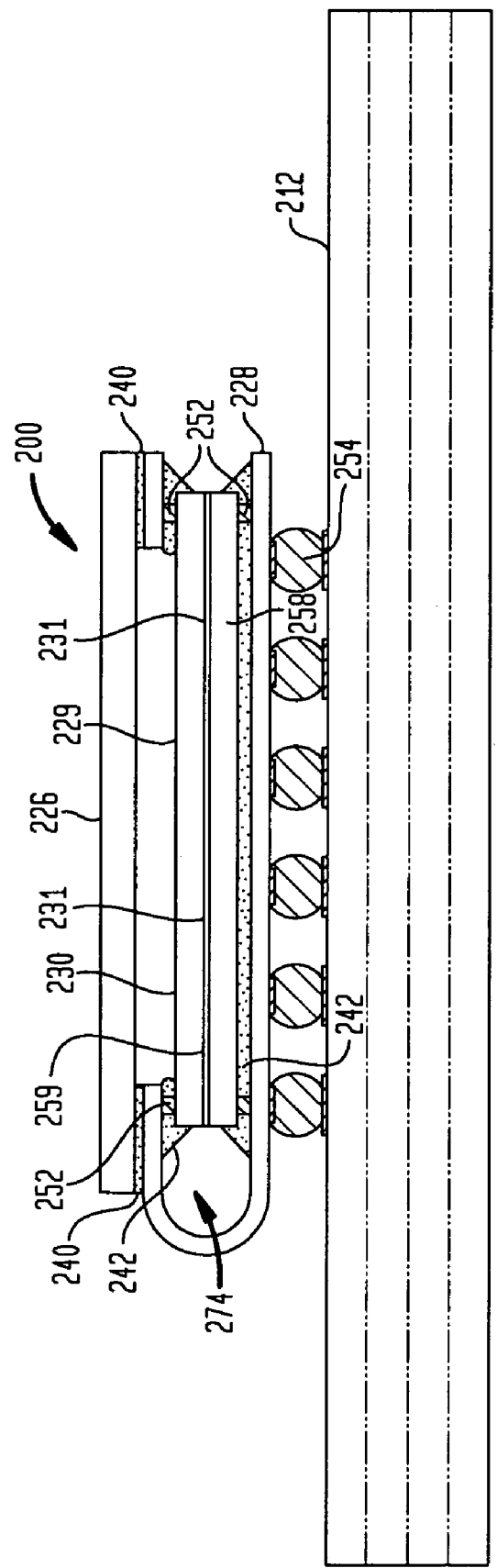
FIG. 9 is a diagrammatic front elevation view of an image sensor package constructed in accordance with an embodiment of the present invention.

Referring to FIG. 9, there is shown another embodiment of an image sensor package generally designated by reference number 200. The basic elements of the image sensor package 200 include a substrate 228, a transparent body 226, and an image sensor 230 that is electrically coupled to an image sensor controller 258. It should be appreciated that the primary difference between this alternative embodiment and the embodiment shown in FIG. 4 lies in the stacking arrangement of the image sensor controller 258 and image sensor 230. The image sensor controller 258 and image sensor 230 are stacked on top of each other, such that the second surface 231 of the image sensor 230 and second surface 259 of the image sensor controller 258 are directly opposing one another. The transparent body 226 is located overlying the image sensor 230 in a spaced apart relationship. This arrangement reduces the overall size of the image sensor package 200 by eliminating the need for separating the image sensor controller 258 and image sensor 230 with solder balls or additional substrates, such as shown in the embodiment of FIGS. 4A-4H. For a greater understanding of the construction and components of the image sensor package 200, reference will also be made to FIGS. 10A-10G.

Figure 10A:
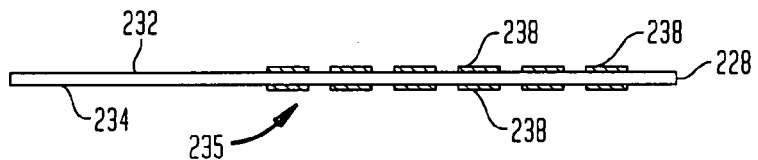
FIGS. 10A-10G are sequential diagrammatic front elevational views showing the sequence in fabricating an image sensor package in accordance with an embodiment of the present invention.

Referring to FIGS. 10A-10G, the steps used to create the image sensor package are illustrated. It should be appreciated that the components and initial steps for arranging this alternative embodiment are identical to the components in the embodiments previously disclosed herein. Referring to FIG. 10A, a substrate 228 is generally a flat planar substrate having first and second surfaces 232, 234. The substrate 228 has electrical conductive elements 235, such as contact pads 238 and traces (not shown) located on the first and second surfaces 232, 234 of the substrate 228 in a circuitized pattern. The substrate 228 is flexible or provided with fold lines so as to be capable of folding over itself to form a central pocket 274 (see FIG. 10G).

Figure 10B:
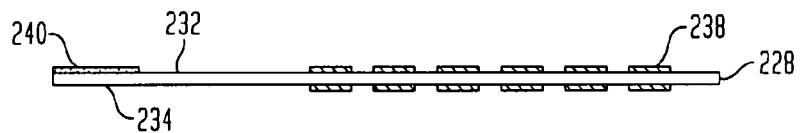

Referring to FIG. 10B, the first surface 232 of the substrate 228 is coated with an adhesive layer 240 of conductive material. The adhesive layer 240 is applied to those portions of the first surface 232 of the substrate 228 where the transparent body 226 will be attached. The adhesive layer 240 is preferably made from a suitable dielectric elastomer material which can be thermal set and applied as a dry film. The adhesive layer 240 is also preferably a compliant material that can act as a stress buffer between the transparent body 226 and the circuit board 212 (see FIG. 9) of the electronic device. It should be appreciated, however, that other polymer materials and adhesive can be used to comprise the adhesive layer 240.

Figure 10C:
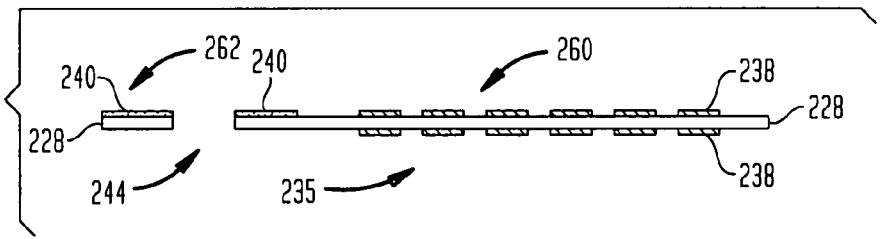

Referring to FIG. 10C, the substrate 228 is separated, using any suitable process known in the art, such as die-cutting, etching, laser ablation and the like, so as to form an opening 244 in the substrate 228. In this embodiment, the opening is formed so that the substrate 228 has a long portion 260 and a short portion 262. The opening 244 can take on any desirable shape and is sized so that the contacts 238 on the second surface 234 of the substrate 228 will align with the electrical conductive elements 235, such as contact pads 238 and/or stud bumps 252, on the image sensor 230.

Figure 10D:
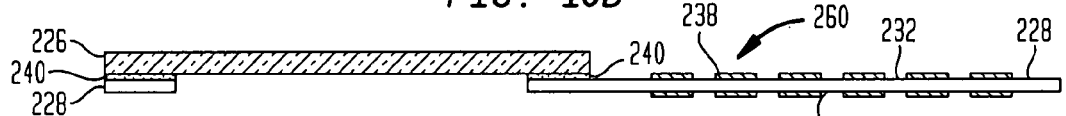

Referring to FIG. 10D, the transparent body 226 is in the nature of a planar substrate and is preferably glass or an IR filter. The transparent nature of the transparent body 226 allows the transmission of light so that the image sensor 230 may capture the images. It is adhered to the short and long portions 260, 262 of the substrate 228 by the adhesive layer 240 contained thereon. To accomplish adhesion, the adhesive layer 240 is heated to the appropriate temperature to cure the adhesive layer 240 which is preferably in the nature of a dry film elastomer thermoset material.

Figure 10E:
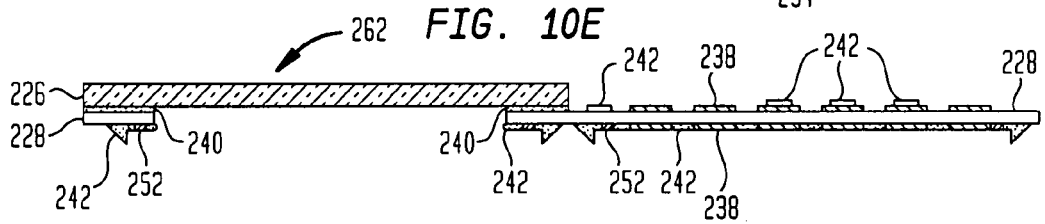

As shown in FIG. 10E, an adhesive layer 242 is also applied to portions of the first and second surfaces 232, 234 of the substrate 228 that correspond to the placement of the image sensor 230 and image sensor controller 258. The adhesive layer 242 is also applied overlying designated portions of the electrical conductive elements 235, such as the contact pads 238 and/or traces (not shown) which are to be used for electrically coupling the electrical conductive elements 235 to the image sensor 230, transparent body 226, and image sensor controller 258. The adhesive layer 242 is preferably an anisotropic conductive material which can provide electrical conductivity in the transverse direction between the joined elements, while being in the nature of an electrical insulator in the other direction. This allows application of the adhesive layer 242 over a plurality of electrical conductive elements 235 as a single layer.

Figure 10F:
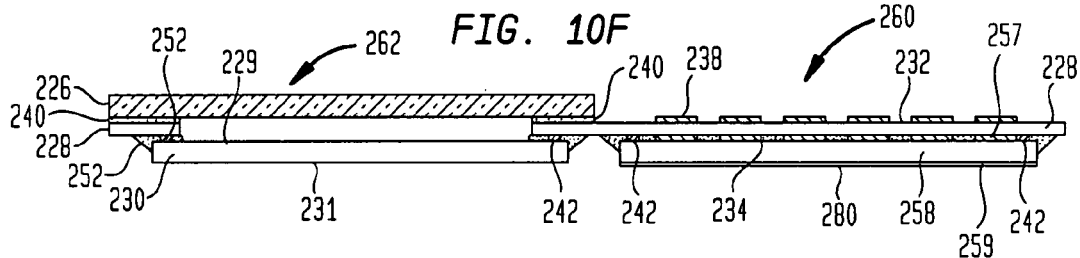

Referring to FIG. 10F, the image sensor controller 258 and the image sensor 230 are attached to the second surface 234 of the substrate 228 by the adhesive layer 242. The image sensor 230 has opposed first and second surfaces 229, 231. The image sensor is in the nature of a die or chip and includes the required semiconductor elements to transform light passing through the transparent body 226 into electrical impulses so as to create images by the use of the electronic device (not shown). The image sensor 230 is capable of using CMOS and CCD sensors, although any type of image processing technology may be implemented in accordance with the present invention.

The image sensor 230 has contacts (not shown) located on its first surface 229 that are aligned with the contacts 238 and stud bumps 252 positioned on the second surface 234 of the long and short portions 260, 262 of the substrate 228. The ends of the first surface 229 of the image sensor 230 are then attached to the second surface 231 of the substrate 228 by the adhesive layer 242 and preferably through the use of thermal compression bonding. The adhesive layer 242 also permits the image sensor 230 to be electrically coupled to the electrically conductive elements 235 on the second surface 234 of the substrate 228.

The image sensor controller 258 has opposing first and second surfaces 257, 259, as well as contact pads (not shown). It is also attached to the second surface 234 of the substrate 228 through the adhesive layer 242. The adhesive layer 242 also provides an electrical connection between the contacts on the image sensor controller 258 and the electrical conductive elements 235. The entire first surface 257 of the image sensor controller 258 is adhered to the second surface 234 of the substrate 228. The adhesive layer 242 also permits the image sensor controller 258 to be electrically coupled to the electrically conductive elements 235 on the second surface 234 of the substrate 228. It should be appreciated, however, that if a non-conductive adhesive is utilized, the image sensor controller 258 and the image sensor controller 258 may be electrically coupled to the electrical conductive elements directly by wire bonds (not shown) such as previously disclosed herein.

Figure 10G:
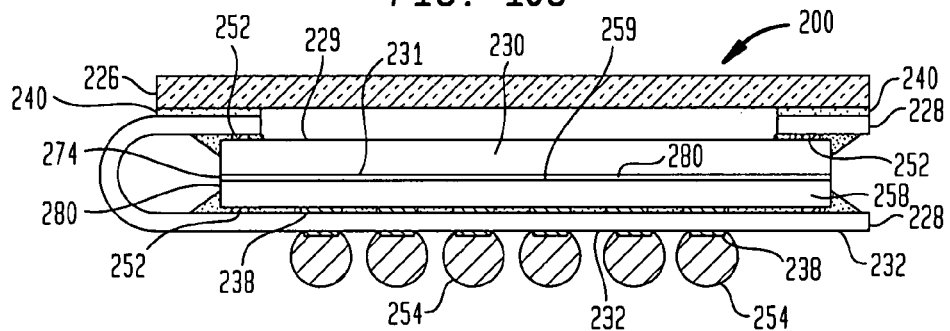
Figure 12A:
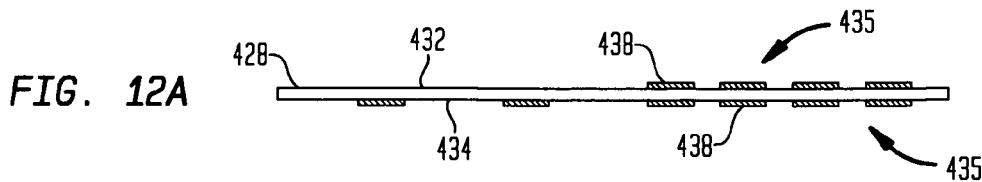
FIGS. 12A-12F are sequential diagrammatic front elevational views of an image sensor package constructed in accordance with an embodiment of the present invention.
Figure 12B:
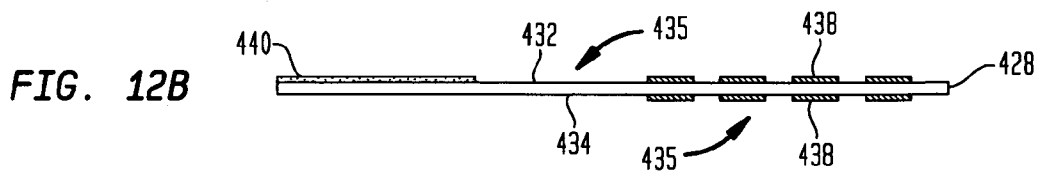
Figure 12C:
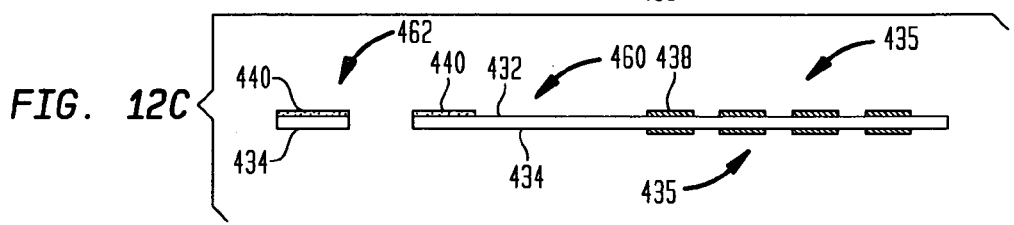
Figure 12D:
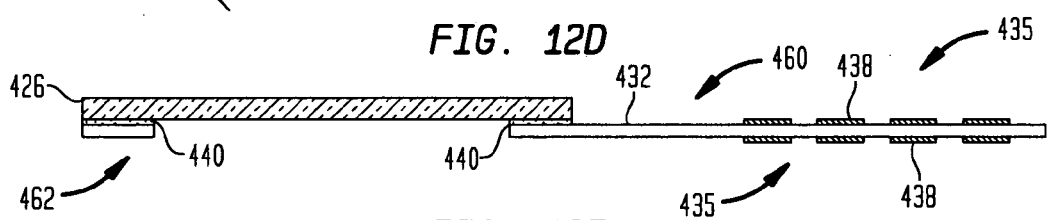
Figure 12E:
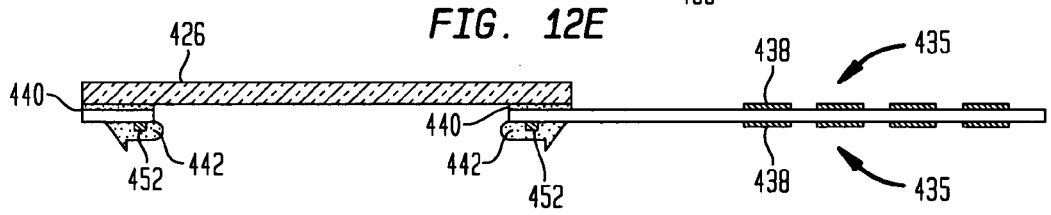
Figure 12F:
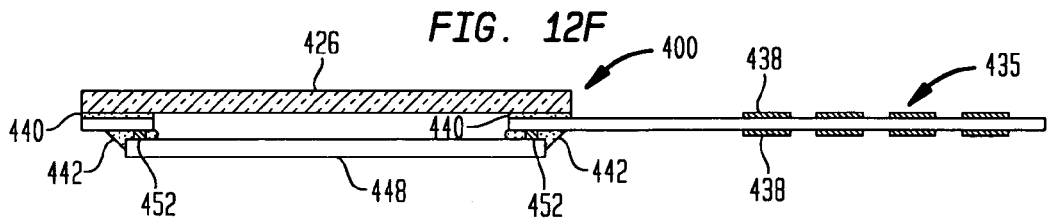

An adhesive layer 280 is also applied to the second surface 231 of the image sensor 230 and/or the second surface 259 of the image sensor controller 258. In the preferred embodiment, it is only applied to one side. Referring to FIG. 10G, the substrate 228 is then folded over itself so that the second surface 231 of the image sensor 230 and the second surface 259 of the image signal controller 258 are opposing one another and a central pocket 274 is formed. Thermal bonding may be used to secure the bond between the image sensor controller 258 and image sensor 230 so as to retain the image sensor package 200 in its folded position.

Solder balls 254 are attached to contact pads 238 located on the first side 232 of the long portion 260. The solder balls 254 are arranged to form part of the electrical conductive elements 235. Once the image sensing package 200 is assembled, including the solder balls 254, the image sensor 230 and image sensor controller 258 can be electrically coupled to a circuit board (not shown) or the like.

Referring to FIGS. 11A-11G, there is shown another embodiment in accordance with the present invention. In this embodiment, the image sensor 330 and image sensor controller 358 are merged into a single image sensing unit 348 (see FIG. 11F). That is, instead of having two separate structures for the image sensor 230 and image sensor controller 258, the two structures have been combined together. This provides for an even more compact image sensor package 300.

The initial steps for constructing this embodiment are identical to the descriptions concerning FIGS. 10A-10D. As shown in FIG. 11A, a substrate 328 is obtained that has electrical conductive elements 335, including contacts 338 and traces (not shown) preferably arranged in a circuitized pattern. Referring to FIG. 11B, an adhesive layer 340 is applied to portions of the first surface 332 of the substrate 328 that will correspond to the placement of a transparent body 326. Referring to FIG. 11C, the substrate 328 is separated, so that there is an opening 344 and a long portion 360 and a short portion 362. As shown in FIG. 11D, a transparent body 326 is adhered to corresponding portions of the first surfaces 332 of the long and short portions 360, 362 of the substrate 328 by the adhesive layer 340. Once the transparent body 326 has been attached to the long and short portions 360, 362 of the substrate 328 (see FIGS. 11A-11D), an adhesive layer 342, preferably comprised of an anisotropic material, is applied to the second surfaces 334 of the long and short portions 360, 362 of the substrate 328 (See FIG. 11E). Thereafter, as shown in FIG. 11F, an image sensing unit 348 is attached to the second surface 334 of the substrate 328, which is also directly below the transparent body 326. Referring to FIG. 11G, the long portion 360 of the substrate 328 is then folded over itself so that the second surface 334 of the substrate 328 is attached to the image sensing unit 348, thereby forming a pocket 364. Solder balls 354 are then attached to the contact pads 338 to provide an electrical connection between the electrical device and each of the components of the image sensor package 300.

Figure 13:
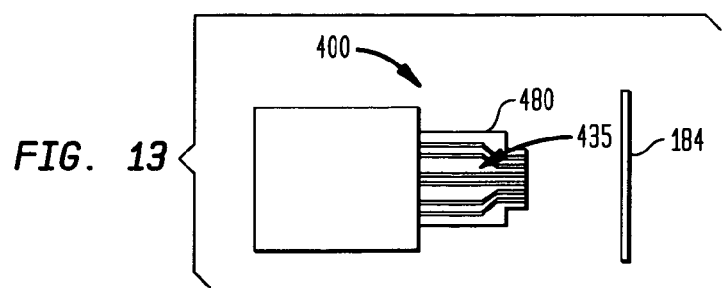
FIG. 13 is diagrammatic top plan view of the image sensor package shown in FIG. 12 adapted to be coupled to an electronic device.

Referring to FIGS. 12A-12F, another embodiment in accordance with the present invention is shown. This embodiment contemplates a direct-chip-plug-in image sensor package 400. The image sensor package 400 is adapted to be electrically connected to an electronic device (not shown) without the intermediate use of solder balls (such as disclosed in FIGS. 9-11). As shown in FIGS. 12A-12D, the initial packaging arrangement is similar to the arrangements previously discussed. A rigid substrate 428 is obtained that has electrical conductive elements 435, such as traces 480 (see FIG. 13), and contact pads 438, that are located on first and second surfaces 432, 434, and that are preferably arranged in a circuitized pattern.

An adhesive layer 440 is applied to portions of the first surface 432 of the substrate 428, and the substrate 428 is then separated into a long portion 460 and short portion 462 (see FIG. 12 C). As shown in FIG. 12D, the transparent member 426 is attached at its ends to the first surfaces 432 of the long and short portions 460, 462 of the substrate 428. Referring to FIG. 12E, an adhesive layer 442 is also applied to those portions of the second surface 434 of the substrate 428 that will correspond to the location of the image sensing unit 448. Stud bumps 452 are also utilized to provide conductivity between the image sensing unit 448 and the substrate 428. The image sensing unit 448 is only attached to a small portion of the long portion 460 of the substrate 428, so as to allow the substrate 428 to extend outwards away from the central portion of the package (FIG. 12F). The portion of the substrate 428 that extends away from the central portion of the packages has exposed electrical conductive elements 435 that can be directly plugged into a connector 184 (FIG. 13), such as a computer or the like.

Figure 14:
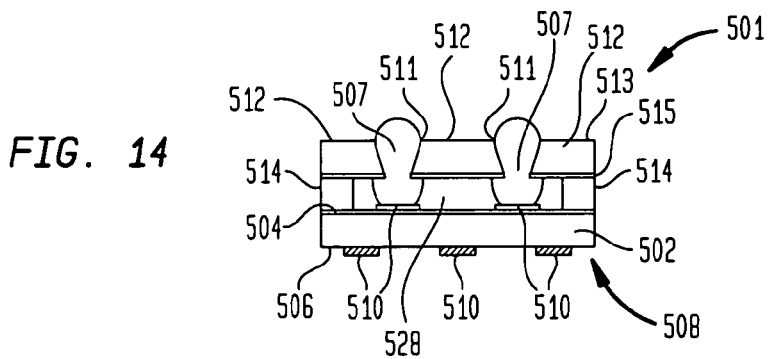
FIG. 14 is a front elevational view of a wafer unit that can be used in accordance with the present invention.
Figure 15A:
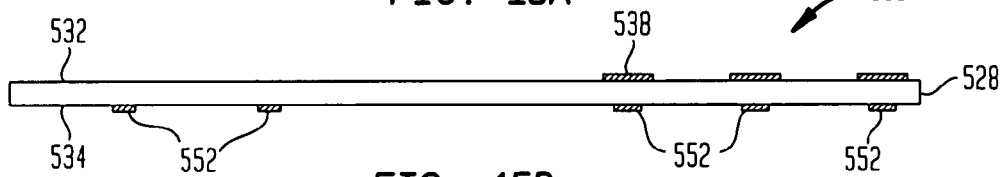
FIGS. 15A-15D are sequential diagrammatic front elevational view of an image sensor package constructed in accordance with an embodiment of the present invention.
Figure 15B:
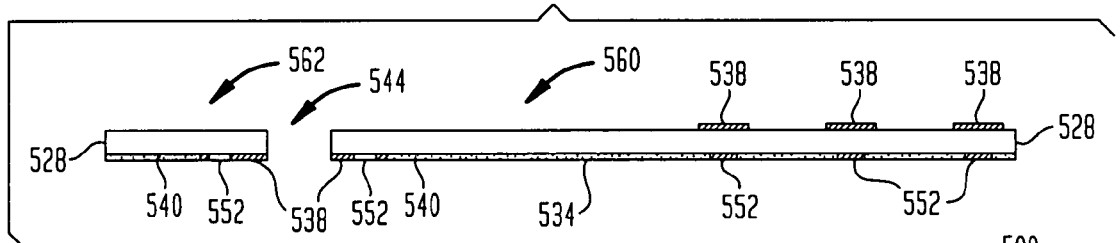
Figure 15C:
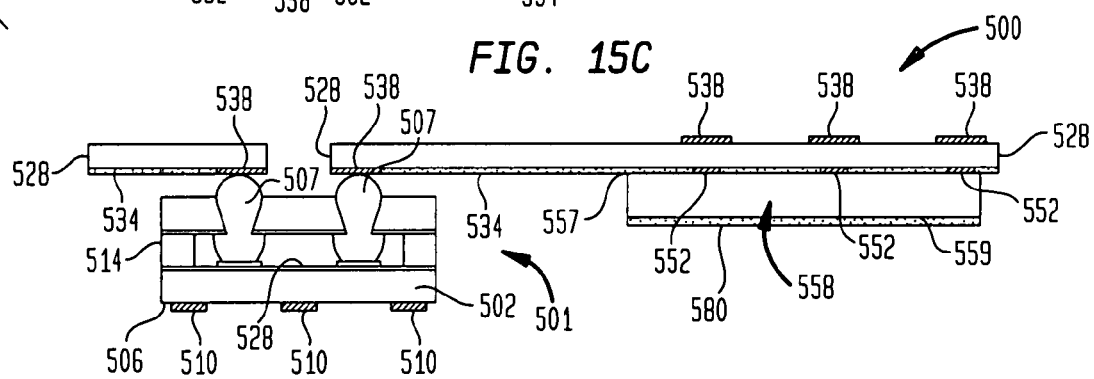
Figure 15D:
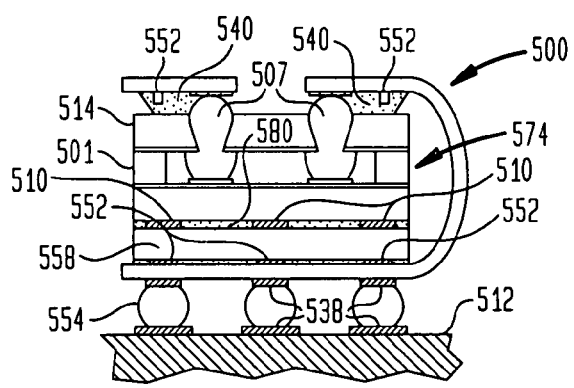

Referring to FIGS. 14-15D, an alternative image sensing package 500 is disclosed that utilizes pre-packaged wafer scale units, such as disclosed in U.S. application Ser. No. 10/949,674, which was filed on Sep. 24, 2004, and is incorporated herein by reference. Referring to FIG. 14, an embodiment of a wafer unit 501 or capped chip is shown. The wafer unit 501 includes an image sensor 502 having opposed first and second surfaces 504, 506. Electrical conductive elements 508, including contact pads 510 and traces (not shown), are preferably located on the first and second surfaces 504, 506 of the image sensor 502. The contacts 510 on the first surface 504 of the image sensor preferably contain solder-wettable regions. A transparent cap 512 overlies the image sensor 502, and is preferably comprised of glass, or alternatively may be an IR filter. The transparent cap 512 has opposing top and bottom surfaces 513, 515, and through holes 511 that may be provided on the transparent cap 512 by any technique suited for the selected material, such as by etching or drilling. A sealing medium 514, preferably including at least one material selected from the group consisting of solder, eutectic composition, and tin, is used to bond the transparent cap 512 to the image sensor 502. However, the bottom surface 515 is spaced from the first surface 504 of the image sensor 502 so as to define a gas-filled void or vacuum void 528 between the transparent cap 512 and the image sensor 502. The gas filled void 528 is preferably filled with a gas, such as nitrogen, but other types of gas may be used in accordance with the present invention. Due to the through holes 511 in the transparent cap 512, solder 507 can be reflowed onto the contact pads 510 located on the first surface of the image sensor 502 through each of the through holes 511. A small portion of the solder 507 remains exposed on the top surface of the transparent cap 512 so as to provide for an external electrical connection to the substrate 528 (which will form the basis of the image sensing package 500). The wafer unit 501 is thus a pre-prepared wafer unit containing an image sensor 502 that can be readily mounted to other electrical components via the exposed solder 507.

Referring now to FIG. 15A, a flexible substrate 528 which will house the wafer unit 501 is shown that is preferably comprised of dielectric material, such as a polyamide. The substrate 528 has first and second surfaces 532, 534 and fold lines that permit the substrate 528 to fold over itself to form a central pocket 574 (see FIG. 15D). Electrical conductive elements 535, such as contact pads 538, stud bumps 552 and traces (not shown) are preferably arranged on the first and second surfaces 532, 534 of the substrate 528 in a circuitized pattern. The electrical conductive elements 535 may be arranged to coincide with contact pads (not shown) that will be located on the image sensor controller 558, as well as the location of contact pads on a circuit board 512 or the like.

As shown in FIG. 15B, an adhesive layer 540 is applied to the second surface 534 of the substrate 528. The substrate 528 is then separated into a long portion 560 and short portion 562, so as to provide an opening 544. The adhesive layer 540 is preferably comprised of an anisotropic material so as to provide electrical conductivity between each of the components of the package. If it is desired to use an adhesive layer that does not possess anisotropic properties, wires may be provided through the substrate so as to place each of the components of the image sensing package 500 in electrical communication with one another, such as previously disclosed herein.

Referring to FIG. 15C, the wafer unit 501 and image sensor controller 558 are mounted to the second surface 534 of the substrate 528. The wafer unit 501 is mounted to the substrate 528 by soldering the exposed solder to the contact pads 538 on the substrate 528 using conventional surface-mounting soldering techniques. The image sensor controller 558 has opposing first and second surfaces 557, 559, both of which both have electrical conductive elements, including contact pads (not shown) contained thereon. The first surface 557 of the image sensor controller 558 is mounted and secured to the second surface of the long portion 560 on the substrate 528 by the adhesive layer 540.

Another adhesive layer 580 is applied to the second surface 506 of the image sensor 502 (also the bottom 506 of the wafer unit 501) and/or the second surface 559 of the image sensor controller 558. In the preferred embodiment, the adhesive layer 580 is applied to the second surface 559 of the image sensor controller 558.

Referring to FIG. 15D, the substrate 528 folds over itself so that the bottom of the wafer unit 501 and the second surface 559 of the image sensor controller 558 directly contact one another. It should be appreciated that they may contact one another through contact pads 510 or the wafer unit 510 and image sensor controller 558. Alternatively, because they will be in electrical communication with one another via the anisotropic adhesive 540 located on the second surface 534 of the substrate 538, it is unnecessary to provide contact pads on the wafer unit 501. Solder balls 554 may then be attached to the contact pads 538 located on the first surface of the substrate 528 to place the image sensor package 500 in electrical communication with an electrical device or the like (not shown).

Figure 16D:
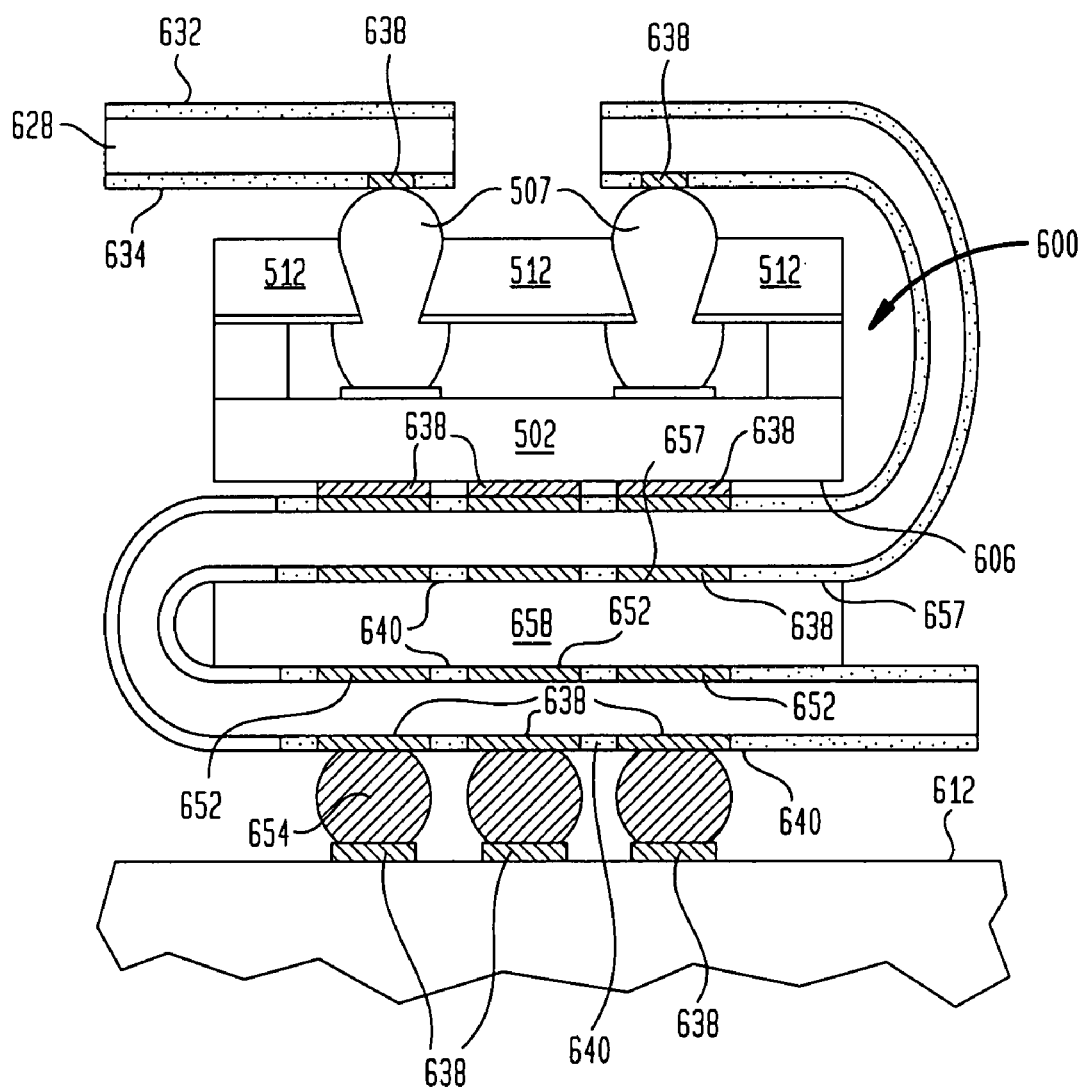

Referring to FIGS. 16A-16D, an alternate embodiment in accordance with the present invention is shown that also utilizes the wafer unit 501 shown in FIG. 14. Referring to FIG. 16A, a long flexible substrate 628 preferably comprised from a polyamide is obtained having first and second surfaces 632, 634. On its first and second surfaces 632, 634, the substrate has electrical conductive elements 635, such as contacts 638, stud bumps 652, or traces (not shown) preferably dispersed in a circuitized pattern.

Referring to FIG. 16B, an adhesive layer 640 preferably possessing anisotropic properties, is placed onto both first and second surfaces 532, 534 of the substrate 628 so as to overly the electrical conductive elements 635. The substrate 628 is then separated into a long portion 660 and a short portion 662.

Referring to FIG. 16C, the pre-prepared wafer unit 501 is soldered to the second surfaces 634 of the short and long portions 662,660 of the substrate 628 using conventional surface-mounting soldering techniques. The image sensor controller 658, however, is attached to the first surface 632 of the substrate 628 by the adhesive layer 640.

As shown in FIG. 16D, the substrate 628 is folded into two sections so that the second surface 634 of the substrate 628 underlies the second surface 580 of the image sensor 502, and the first surface 632 of the substrate 628 overlies the first surface 657 of the image sensor controller 658. The preferable use of anisotropic adhesive layers allows the image sensor controller 658, image sensor 502, and the substrate 628 to be in electrical communication with one another. It should be appreciated that if a non-conductive adhesive layer is used, wires may be passed through the substrate 628 to ensure that each of the elements are in electrical communication with one another.

Solder balls 654 may also be attached to the contact pads 638 and a circuit board 612 or the like so as to provide an electrical connection between the image sensor package 600 and an electrical device (not shown).

Figure 17:
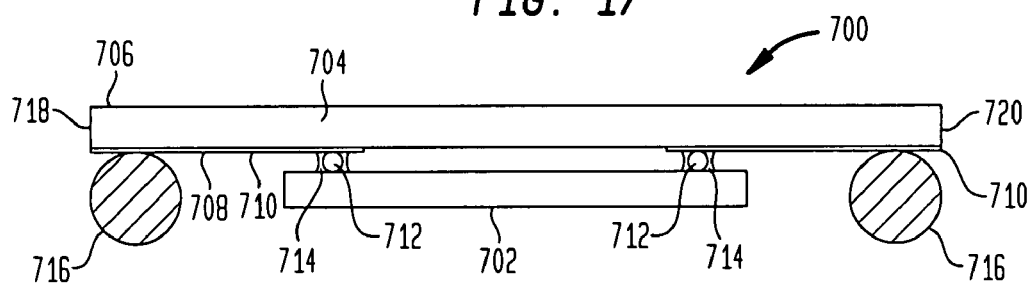
FIG. 17 is a front elevational view of an image sensor package constructed in accordance with an alternative embodiment of the present invention.

Referring to FIG. 17, an alternative image sensor package 700 in accordance with the present invention is shown. As will be described in further detail herein, the image sensor 702 is directly attached to the transparent body 704, thereby eliminating the need for an intermediate substrate located between the image sensor 702 and transparent body 704, such as those described in the aforementioned embodiments.

The transparent body 704 is preferably comprised of glass, and has opposing first and second surfaces 706, 708. The second surface 708 of the transparent body 704 has a means for providing electrical conductivity between the components of the image sensor package. Preferably, it is circuitized using electrical conductive elements 710, including circuit traces and contacts (not shown). Methods of circuitizing the surface of the transparent body 704 are well known in the semiconductor art and may be implemented in accordance with the present invention.

The image sensor 702 is attached to the transparent body 704 using solder balls 712. The solder balls 712 may be deposited onto the glass using known methods of solder deposition, such as those described herein. Similarly, large solder balls 116 are preferably deposited at first and second ends 718, 720 of the transparent body 704 and are in electrical communication with the image sensor 702 via the electrical conductive elements 710 and solder balls 712 located between the image sensor 702 and the transparent body 704.

The electrical connection or active area between the image sensor 702 and transparent body 704 may be sealed to protect it from the surrounding environment. For example, small amounts of adhesive material may be deposited around the solder balls 712. It should be appreciated, however, that although preferred, a seal is not required.

Figure 18:
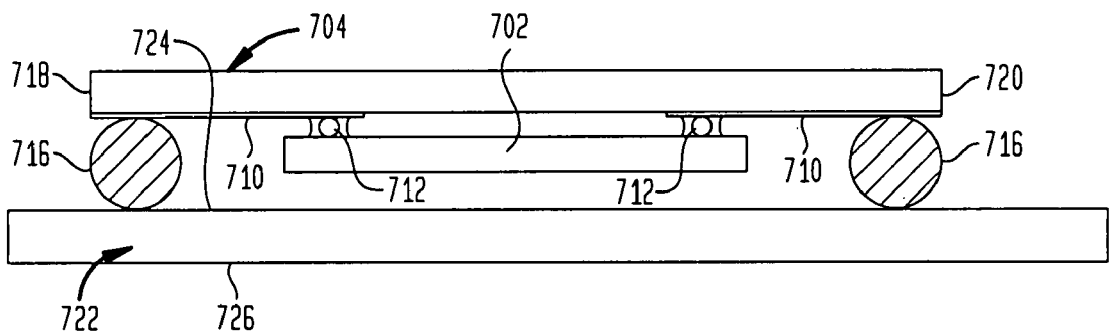
FIG. 18 is a front elevational view of an image sensor package in accordance with another alternative embodiment of the present invention.
Figure 19:
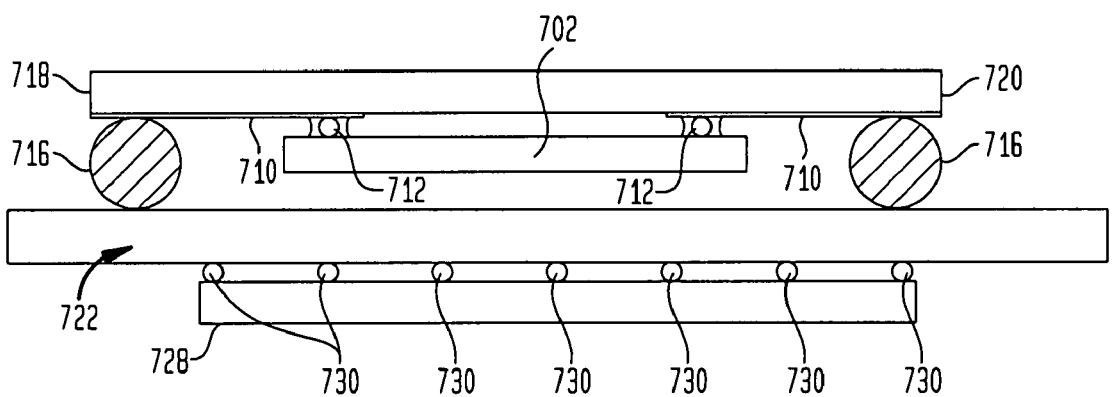
FIG. 19 is a front elevational view of an image sensor package in accordance with an alternative embodiment of the present invention.

Referring to FIG. 18, the image sensor package may be attached to a printed circuit board 722, which has first and second surfaces 724, 726. Furthermore, as shown in FIG. 19, a digital signal processor 728 can be attached to the second surface 726 of the printed circuit board 722 using solder balls 730 located between the second surface of the printed circuit board 722 and the digital signal processor. The image sensor package 700 and digital signal processor 728 are in electrical communication via wires (not shown) extending through the circuit board, or any known means of providing for an electrical connection between the two packages.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An image sensor package comprising:
(a) a substrate having a first surface and a second surface, the substrate having an opening extending through the substrate from the first surface to the second surface;
(b) an image sensor attached to the second surface of the substrate so that the image sensor is aligned with the opening of the substrate, the image sensor having opposing first and second surfaces;
(c) a transparent body adhered to the first surface of the substrate and overlying the opening and the first surface of the image sensor; and
(d) an image sensor controller attached to the second surface of the substrate and having opposing first and second surfaces, the second surface of the image sensor controller and the second surface of the image sensor being directly attached to one another so that the second surfaces of the image sensor and the image sensor controller are directly adjacent one another, the first and second surfaces of the substrate supporting electrically conductive elements so that the image sensor and the image sensor controller are in electrical communication with one another wherein an adhesive is disposed between the second surfaces of the image sensor and image sensor controller and attaches the second surfaces of the image sensor and the image sensor controller to one another.

2. The image sensor package according to claim 1, wherein an anisotropic adhesive is used to adhere the image sensor to the substrate.

3. The image sensor package according to claim 1, wherein an anisotropic adhesive is used to adhere the image sensor controller to the substrate.

4. The image sensor package according to claim 1, wherein a wire connects the image sensor to the image sensor controller.

5. The image sensor package according to claim 1, wherein the substrate is flexible.

6. The image sensor package according to claim 1, wherein the substrate is rigid.

7. The image sensor package according to claim 1, further including a circuit board for an electronic device, the circuit board being connected to the electrically conductive elements of the substrate.

8. The image sensor package according to claim 1, wherein the substrate is folded over itself.

9. An electronic device for creating digital images, the device comprising:
a housing;
an image sensor package within the housing, the image sensor package including;
a substrate having a first surface and a second surface, the substrate having an opening extending through the substrate from the first surface to the second surface;
an image sensor attached to the second surface of the substrate so that the image sensor is aligned with the opening of the substrate, the image sensor having opposing first and second surfaces;
a transparent body adhered to the first surface of the substrate and overlying the opening and the first surface of the image sensor; and
an image sensor controller attached to the second surface of the substrate and having opposing first and second surfaces, the second surface of the image sensor controller and the second surface of the image sensor being directly attached to one another so that the second surfaces of the image sensor and the image sensor controller are directly adjacent one another,
the substrate supporting electrically conductive elements so that the image sensor and the image sensor controller are electrically connected to one another; and
an electronic module responsive to the image sensor controller for at least creating digital images within the housing,
the image sensor and the image sensor controller being electrically connected to the electronic module.

10. The image sensor package of claim 9, wherein the substrate is U-shaped.

11. An image sensor package comprising:
(a) a sensor substrate having oppositely-directed first and second surfaces, an opening extending therebetween, and electrically conductive elements exposed at the second surface;
(b) an image sensor mounted to the sensor substrate and facing the second surface of the sensor substrate, the image sensor being aligned with the opening in the sensor substrate and electrically coupled to the electrically conductive elements of the sensor substrate;
(c) a transparent body coupled to the first surface of the sensor substrate in alignment with the opening;
(d) a controller substrate having a first surface facing toward the sensor substrate and a second surface facing away from the sensor substrate, the image sensor being disposed between the sensor substrate and controller substrate, the controller substrate having first electrically conductive elements exposed at the first surface of the controller substrate and connected to the electrically conductive elements of the sensor substrate, the controller substrate having second electrically conductive elements exposed at the second surface of the controller substrate, the second electrically conductive elements being adapted for mounting to a circuit board; and
(e) an image controller mounted to the controller substrate and electrically connected to the sensor through the first conductive elements of the controller substrate and the conductive elements of the sensor substrate.

12. The image sensor package of claim 11, wherein the image sensor is electrically connected to the electrically conductive elements of the sensor substrate by anisotropic conductive material.

13. The image sensor package of claim 11, wherein the transparent body is attached to the sensor substrate by compliant material.

14. The image sensor package of claim 11, further including a circuit board arranged opposing the image controller substrate, the circuit board being electrically coupled to at least the second electrically conductive elements.

15. The image sensor package of claim 11, wherein the controller substrate is folded over itself forming spaced apart opposing first and second image controller substrate portions with the image controller arranged therebetween.

16. A device comprising a housing, a circuit board disposed within the housing and a package as claimed in claim 11 disposed within the housing and mounted to the circuit board, the circuit board having conductive features, the second electrically conductive elements of the controller substrate being connected to the conductive features of the circuit board.

17. The device of claim 16, wherein the device comprises a cellular phone.

18. The device of claim 16, wherein the device comprises a personal digital assistant.

19. The device of claim 16, wherein the image sensor is electrically coupled to the electrical conductive elements of the sensor substrate by anisotropic conductive material.

20. The device of claim 16, wherein the transparent body is attached to the sensor substrate by compliant material.

21. The device of claim 16, wherein the controller substrate is folded over itself forming spaced apart opposing first and second controller substrate portions with the image controller arranged therebetween.

* * * * *